United States Patent [19]

Cuomo et al.

[11] 4,062,038
[45] Dec. 6, 1977

[54] RADIATION RESPONSIVE DEVICE

[75] Inventors: Jerome John Cuomo, Bronx; Thomas Herman DiStefano, Tarrytown; Robert Rosenberg, Peekskill, all of N.Y.

[73] Assignee: International Business Machines Corporation, Armonk, N.Y.

[21] Appl. No.: 652,961

[22] Filed: Jan. 28, 1976

[51] Int. Cl.² .......................................... H01L 27/14
[52] U.S. Cl. ...................................... 357/30; 357/59; 357/60; 357/88
[58] Field of Search .................... 357/30, 59, 60, 88

[56] References Cited

U.S. PATENT DOCUMENTS

| | | | |
|---|---|---|---|
| 3,579,815 | 5/1971 | Gentry | 29/580 |
| 3,953,876 | 4/1976 | Sirtl | 357/60 |
| 3,956,765 | 5/1976 | Fischer | 357/30 |
| 3,971,057 | 7/1976 | Connors | 357/30 |

FOREIGN PATENT DOCUMENTS 923,513   4/1963   United Kingdom .................... 357/88

*Primary Examiner*—Martin H. Edlow
*Attorney, Agent, or Firm*—Bernard N. Wiener

[57] ABSTRACT

The practice of this disclosure obtains a relatively high efficiency operation for a crystalline semiconductor solar cell containing various defects of the linear and planar types. Linear defects include screw dislocations as well as full and partial dislocations. Planar defects include twins, stacking faults, grain boundaries and surfaces. Such defects normally contain recombination centers at which electrons and holes generated in the semiconductor region recombine with loss to the external current of the charge carried thereby. Through application of the principles of this invention, especial dopant concentrations and conductivity regions are established in a finite region around the linear and planar defects so that electrons and holes which are generated in the semiconductor region by incident radiation are substantially collected for external current as consequence thereof.

9 Claims, 20 Drawing Figures

RADIATION RESPONSIVE DEVICE

BACKGROUND OF THE INVENTION

Heretofore, in the practice of the prior art semiconductor devices have been achieved in crystalline material in which there are linear and planar defects e.g., dislocations and grain boundaries in the semiconductor region in which separation of electron-hole pairs is achieved. The energy out has been deleteriously altered by the recombination process at recombination centers predominately located in linear and planar defects. It has not been realized heretofore what could be a means of effectively neutralizing this deleterious effect except by procedures which were directed primarily toward the growth of the crystalline material per se.

The prior art impediment to efficient operation of prior semiconductor devices has been especially difficult for solar cell applications. In such solar cell operation, it is the absorption of radiation photons which produces electron-hole pairs. There has not been available technology for improving the output efficiency for current carrying capability of a given semiconductor region with deleterious defects. Consequently, there has been considerable need for advancing the art of semiconductor solar cells for an applicable procedure whereby the deleterious effect arising from the intrinsic characteristics of linear and planar defects, could be obviated, in spite of the presence of the known impediment to the operation of the device.

Although it has been suggested in the prior art that recombination sites could be effectively destroyed since they are due to atoms in the crystal defects, it has not been known how to accomplish a neutralization of the deleterious effects of the recombination centers even though there is continuing presence of the centers in the device.

It is through the practice of the present invention that the difficulties with prior art recited above are obviated. Actually, in certain instances of the practice of the present invention, operational efficiency of crystalline semiconductor solar cells are actually improved over the efficiency obtainable with the most careful fabrication procedures yet applied for a comparable prior device.

OBJECTS OF THE INVENTION

It is an object of this invention to provide a solar cell with relatively high operational efficiency comprised of crystalline semiconductor material containing what are otherwise deleterious linear and planar defects.

It is another object of this invention to provide the foregoing solar cell with efficiency per unit volume comparable to or greater than the efficiency per unit volume of a comparable region of single crystalline material of the same semiconductor material.

It is another object of this invention to provide a polycrystalline semiconductor material for a solar cell whose construction includes columnar grains with grain boundaries approximately parallel to each other and with preferential and selective dopant concentrations introduced in the regions immediately adjacent to the grain boundaries.

It is another object of this invention to provide a polycrystalline semiconductor solar cell which has a greater operational efficiency than the efficiency for a comparable prior polycrystalline semiconductor solar cell by specially treating the semiconductor material near the grain boundaries in order to preclude substantially the arrival at said grain boundaries of charge carriers which would otherwise participate in a deleterious recombination process for which eliminates an electron-hole pair.

It is another object to provide a crystalline semiconductor solar cell in accordance with the principles of this invention wherein efficiency of operation is especially determined for particular operating conditions by selectively doping or selectively treating the original semiconductor material.

It is another object of this invention to obviate the deleterious recombination centers in a radiation responsive crystalline semiconductor device that localized at linear and planar defects of the semiconductor region of said device by a procedure which includes at least the following identified diffusion steps; a first relatively low temperature treatment which admits dopant to the linear and planar defects and a second relatively high temperature treatment which causes said admitted dopant to be established as a relatively high concentration thereof in the neighborhood of the defects.

It is another object of this invention to provide a radiation responsive device which includes a semiconductor region in which the internal electric field pattern due to a semiconductor junction and especially located dopant concentrations effect preferential repulsion of charge carriers of one conductivity type from the recombination centers, located within the selectively doped portion of the material, which would otherwise cause loss of a quantity of electron-hole pairs.

SUMMARY OF THE INVENTION

The fabrication of efficient solar cells from crystalline films of semiconducting material is described herein for practice of the disclosed invention. Illustratively, a polycrystalline film is fabricated so that each grain extends through the thickness of the film in a columnar structure. Illustratively, this is done by depositing the film onto a heated substrate, e.g., columnar growth of GaAs, ZnO, or CdS is accomplished by sputtering it onto a substrate held at a temperature of about 300° C. Further, exemplary columnar thin films can be formed in most of the III-V compounds. The grain surfaces and boundaries are doped in accordance with the principles of this invention so that minority carriers are repelled from the grain boundary and surface region.

An exemplary structure provided by the practice of this invention corresponds to a collection of several single-crystal solar cell devices which are connected in parallel. The lifetime for minority carriers in each grain is kept high by the character of the electric field pattern near to the grain boundaries which keeps minority carriers away from the large number of recombination centers normally located in the boundary region. This invention does not teach a means or method for reducing or eliminating the large number of recombination centers or surface states normally found on the grain boundary or each crystallite of semiconductor material.

In particular, for an embodiment including a polycrystalline film, a dopant is diffused into the polycrystalline film at such a low temperature that grain boundary diffusion is the dominant impurity diffusion mechanism. A second higher, temperature anneal is used to diffuse the dopant in the grain boundary a short distance into the region of material surrounding the actual grain boundary. The preferential doping near the grain boundary develops an electric field pattern which keeps the minority carriers away from the region of the grain boundary. With the preferential grain boundary doping, only carriers produced within approximately one diffusion length of the depletion region contribute to cell current. Therefore, it is important that the depletion region adjacent to the grain boundary regions extend around all sides but the back contact surface on each of the grains in the polycrystalline film so that, for example, with n-doping, the n-type region can substantially collect the electrons generated by light within each grain. By doping the region near the grain boundaries with N-doping impurity, the n-type region is extended to cover the material near the grain boundary in order to collect excess electrons produced in the grain as well as at the same time to repel excess holes so that they do not recombine at the grain boundary.

In the practice of this invention, n-type conductive regions, n-doping and electrons can be interchanged with p-conductive regions, p-doping, and holes, respectively.

A feature of this invention is the provision of a Schottky-barrier junction on the radiation receptive surface of the semiconductor region of a crystalline semiconductor solar cell whereby the internal electric field is shaped so as to substantially preclude the recombination at recombination centers. This feature of the invention is especially applicable for the single crystalline semiconductor silicon to obviate the deleterious defects on the main surface because of the usual fabrication procedures.

PRACTICE OF THE INVENTION

Figure 1:
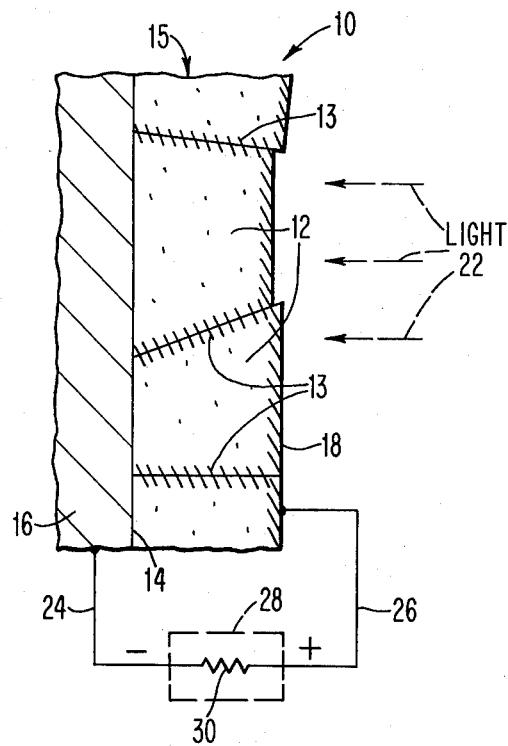
FIG. 1 presents a schematic diagram of a polycrystalline semiconductor e.g., Si, solar cell, in accordance with the principles of this invention in which the grain boundary regions and surface for the incident radiation are treated to increase efficiency, wherein a thin skin of n-type semiconductor material (for N-doping) is made to cover all but one contact surface of each grain.

FIG. 1 illustrates for one embodiment of this invention, the impurity doping in the vicinity of the grain boundaries of a columnar polycrystalline semiconductor solar cell of this invention by a special diffusion process or procedure. Illustratively, a two step process is utilized whereby a particular concentration of N-doping is established in the neighborhood of the grain boundaries, linear defects, planar defects, and the surface proximate to the incident light.

Consequently, the deleterious recombination of electrons and holes from electron-hole pairs which are generated by the incident radiation, which normally occurs in the grain boundaries, linear defects, and planar defects is significantly lessened. Therefore, there is a substantial increase in operational efficiency which is thereby achieved for a polycrystalline semiconductor solar cell. The increase in operational efficiency is understood by comparison with the same material without benefit of the especial doping at the vicinity of the linear and planar defects, e.g., grain boundaries in accordance with the principles of this invention.

The polycrystalline solar cell 10 of FIG. 1 comprises the P-type columnar grains 12 of semiconductor material with grain boundaries 13 which has been deposited on a metallic surface 14, such as platinum, to establish a Schottky barrier therebetween. The metallic layer 16 comprises one electrode of the solar cell 10 and is effectively the collection surface for the generated holes. The n-type surface 18 of the columnar polycrystalline material is the collector surface for the electrons from the electron-hole pairs which are generated in the body of the semiconductor 15 by the incident solar energy 22.

The operational solar cell is partially completed by connecting a conductor 26 to the n-type conductive region near the surface 18 of the solar cell 10. Conductors 24 and 26 are connected to load 28 which illustratively comprises an impedence 30 which is at least partially resistive.

Figure 2:
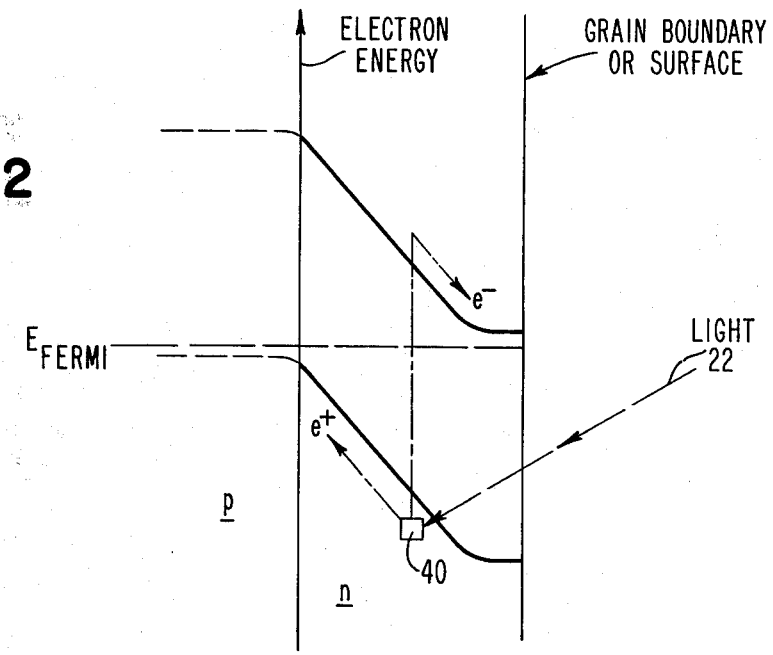
FIG. 2 is a line diagram of the electron energy bands which illustrates how the electron and the hole from an electron-hole pair which is created by light is collected for utilizable external current.

FIG. 2 is a line diagram which exemplifies the electron energy bands at the metallic electrode 16 and at the grain boundary 13 or at the surface 18 which is in the path of the incident radiation for a polycrystalline solar cell fabricated in accordance with the principles of this invention. Thus, an exemplary electron-hole pair 40 comprised of an electron $e^-$ and a hole $e^+$ is generated by the absorption of a photon of solar electromagnetic radiation 22. The hole $e^+$ is transported by the internal electric field to the metallic platinum electrode surface 14 where it is collected, and the electron $e^-$ is transported to the surface of incidence 18 or to a grain boundary 13, where it is collected as for useful current. Both the grain boundaries and the grain surface are locations that are comparable for efficient collection of electrons for each columnar grain of the polycrystalline solar cell fabricated in accordance with the principles of this invention.

The exemplary solar cell 10 of FIG. 1 is fabricated to have a columnar grain structure which may be accomplished by prior art technologies such as the use of polycrystalline slabs or chemical vapor disposition, evaporation, and electrodeposition. A conductive layer 16 establishes a Schottky-barrier contact, an ohmic contact, or a p-n junction 14 with the semiconductor 15. Exemplary conductors 16 therefor are the metals aluminum, chromium, gold, titanium, steel, platinum, palladium and nickel; or the surface of a metal silicide such as platinum silicide, palladium silicide, nickel silicide, and chromium silicide deposited at the interface 14 of the polycrystalline region 15. The result of the exemplary contacts is a Schottky barrier contact at the interface 14 between the back conductive plate 16 and the semiconductor material 15. Alternative to a Schottky barrier junction at the hole electrode collection surface is a p-n junction or an ohmic contact, not shown in FIG. 1.

The polycrystalline solar cell represented schematically in FIG. 1 incorporates semiconducting material that has grain boundaries which are preferably substantially normal to the main surface. There are many different types of crystalline semiconductor materials which can be incorporated in solar cells for the practice of this invention including includes silicon, germanium, III–V compounds, and II–VI compounds. Different efficiencies can be obtained for each material as a function of the energy gap and spectral absorption. For optimal operation, the particular material is related to the nature of the incident radiation, e.g., wavelength thereof.

Among the semiconductor materials suitable for a polycrystalline solar cell fabricated in accordance with the principles of this invention are Si, Ge, CdS, CdTe, GaAs, GaP, and InP. Indeed, all semiconductor materials from which a single crystalline solar cell may be fabricated are available for the practice of this invention in which selected regions, e.g., linear defects, e.g., full dislocations and planar defects e.g., grain boundaries, intersecting the semiconductor surface upon which the radiation is incident are especially treated in accordance with the principles of this invention.

There are many fabrication techniques by which it is possible get the columnar grain boundary structure illustrated in FIG. 1. One procedure is the standard thin film preparation technique whereby material is deposited onto a suitable substrate, such as by chemical vapor deposition, evaporation, or sputtering.

Further the principles of this invention also apply to the preparation of bulk material for solar cell application. Illustratively, by cutting a slab of a polycrystalline bulk material, the structure of FIG. 1 is achieved. In bulk materials and slabs cut from bulk materials, the grain boundaries usually run in the direction of growth. Therefore, by slicing the wafers in a direction perpendicular to the direction of growth of the bulk semiconductor material, grain boundaries in the wafers are perpendicular to the surface.

Thus, one fabrication technique for obtaining the polycrystalline material shown in FIG. 1 is to cut bulk silicon polycrystals into thin slabs. Another fabrication technique is the use of ribbon growth to form a thin slab of semiconductor material. In that way solar cells can be fabricated without the necessity of slicing and dicing the material. Beneficially, semiconductor ribbons contain grain boundaries which are nearly normal to the surface, so solar cells made out of such ribbons contain grain boundaries that are very similar in structure to FIG. 1.

With reference to FIG. 2, the electron energy bands shown for a Schottky barrier junction are readily extended for the situation of an alternative p-n junction. Thus, the dashed line to the left of the vertical line representing electron energy show the electron energy bands for a p-n junction.

PRINCIPLES OF THE INVENTION

For clarity of exposition, the single crystalline and polycrystalline regions to be described in this section will be depicted in somewhat idealized form. The theoretical understanding as which is the basis for the practice of this invention will be exemplified through reference to both single crystalline devices which have n-type and p-type semiconductor regions and a consequent p-n junction therebetween.

Figure 3A:
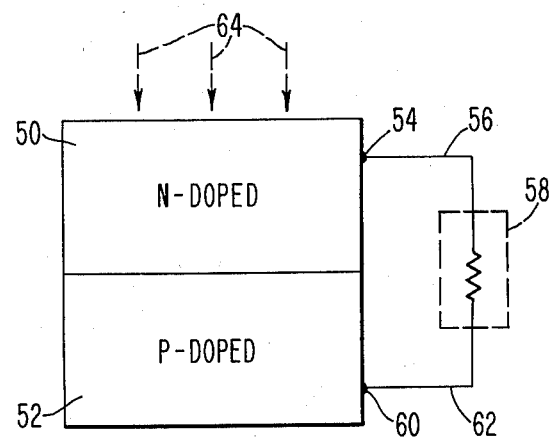
FIG. 3A is a schematic diagram which illustrates the nature of a prior art single crystalline silicon solar cell utilizing a p-n semiconductor junction.
Figure 3B:
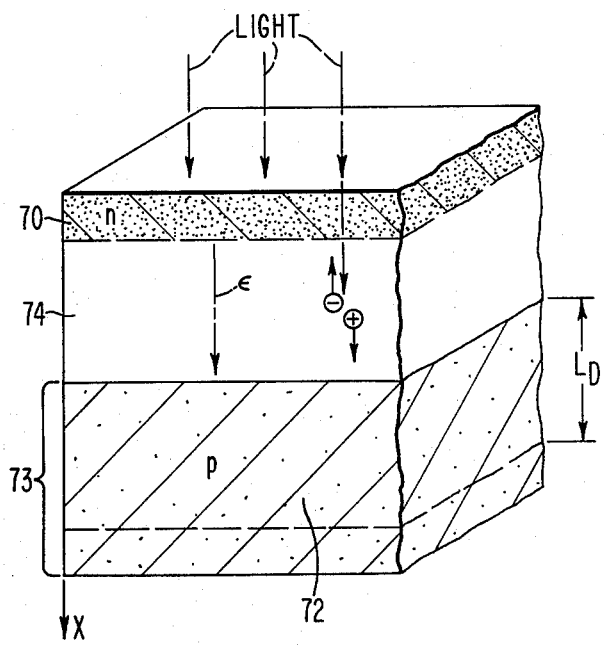
FIG. 3B is a schematic diagram which illustrates the p-type and n-type highly conductive regions of a single crystalline silicon solar cell and shows the depletion region between the conductive regions as well as the diffusion length in the p-type conductive region.

A single crystalline device is illustrated in FIGS. 3A and 3B which has an N-doped region 50, and a P-doped region 52. Contact 54 is connected via connector 56 to impedance 58 which is at least partially resistive. P-type region 52 has contact 60 connected by connector 62 to load impedance 58.

Figure 3C:
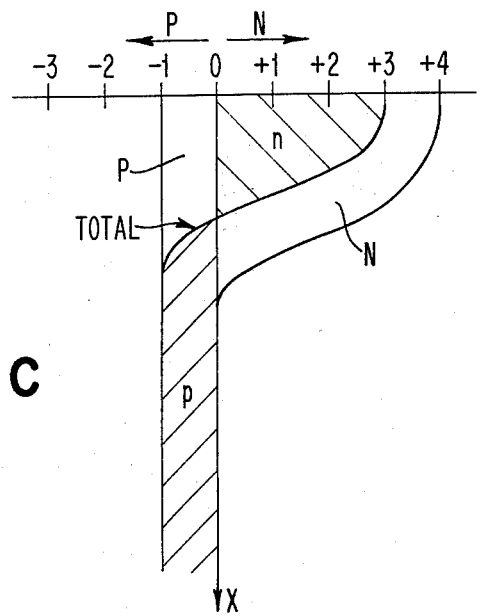
FIG. 3C is a representation of the p-type and n-type doping levels as function of the distance from the surface of the single crystal cell represented in FIG. 3B, along with the total effective doping level.

As consequence of the inherent electrical characteristics of the semiconductor body of FIGS. 3A and 3B there is developed an n-type conductive region 70 and a p-type conductive region 72 with a depletion region 74 therebetween. The depletion region 74 arises by the natural physical processes within the semiconductor body resultant from the actual presence therein of distinguishable n-type and p-type regions. The actual fabrication of n-type and p-type regions may be accomplished in an original p-type material having a nearly uniform P-doping concentration as illustrated in FIG. 3C to the left of the vertical line. It is thereafter transformed partially into an n-type region as the result of diffusion of N-doping by diffusion from the surface or internal boundaries. An electric field $\epsilon$ is established by a natural physical mechanism in the depletion region 74 between the n-type conductive region 70 and the p-type conductive region 72. Electron-hole pairs which are generated in the depletion region 74 and in a layer 73 of the p-type conductive region 72 which is approximately equal to or less than the diffusion length $L_D$ for electrons thereon have the capability of becoming carriers of external current.

As a consequence of inherent recombination centers at grain boundaries, linear defects, planar defects, and surfaces, there is trapping thereat of both electrons and holes which arrive through diffusion. This effectively causes their recombination and destroys them without leaving the capability for external current therefrom. The recombination results in emitted radiation or in Auger energy as a result of transmittal to the lattice of a portion of the recombination energy. Exemplary P-dopant is boron (B) and exemplary N-dopants are arsenic (As) and phosphorus (P) for an exemplary silicon material. The concentrations of the p-type and n-type dopants would be approximately $10^{17}$ atoms/cc for the p-type dopant and $3 \times 10^{19}$ atoms per cc for the N-dopant.

Figure 4A:
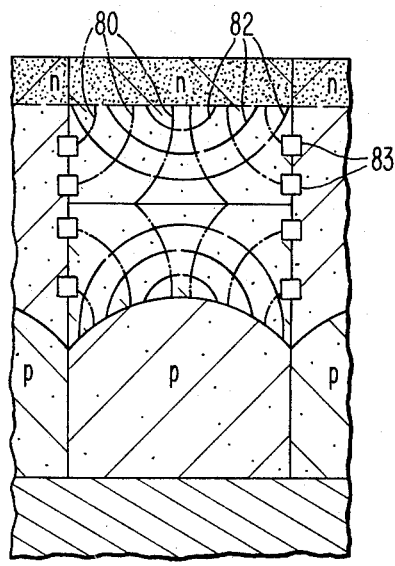
FIG. 4A is a cross sectional diagram illustrating the nature of the electric field lines and equipotential lines in a polycrystalline semiconductor solar cell with columnar grains, wherein the grain boundaries have not been treated in accordance with the principles of this invention.
Figure 4B:
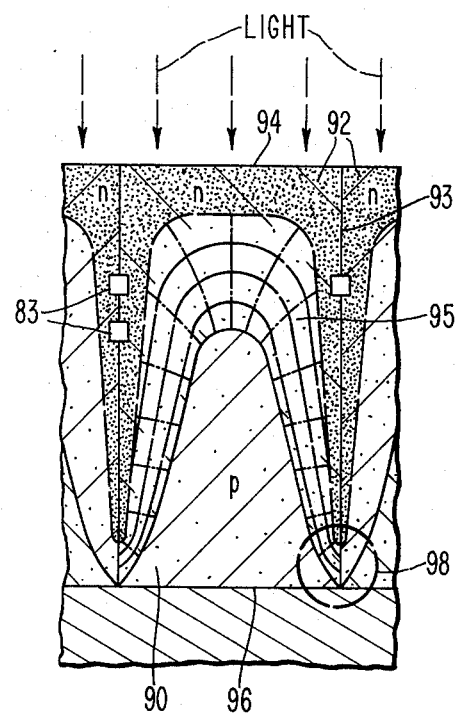
FIG. 4B is a cross sectional diagram of a polycrystalline solar cell with columnar grains, wherein the grain boundaries have been preferentially and selectively treated in accordance with the principles of this invention wherehow efficient operation is obtained.
Figure 4C:
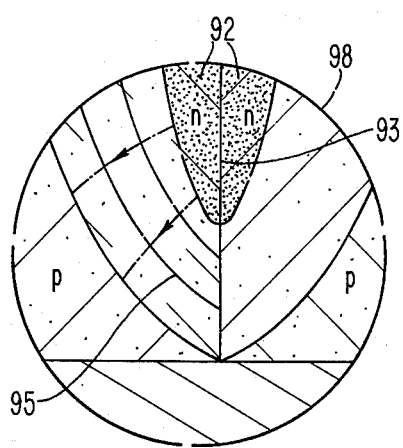
FIG. 4C is a line diagram which illustrates certain details of FIG. 4B in greater detail showing the nature of the conductive n-type region in the vicinity of the grain boundaries adjacent to the back contact to the p-type material.

FIGS. 4A, 4B and 4C illustrate various theoretical considerations concerning polycrystalline semiconductor materials with columnar structures. FIG. 4A shows a columnar structure wherein the grain boundaries are not treated in accordance with the principles of this invention and FIGS. 4B and 4C show columnar structures in which the grain boundaries have been treated in accordance with the principles of this invention.

For clarity of exposition, the subject matter of FIGS. 4A, 4B and 4C will be dealt with under the circumstance of the silicon semiconductor with selectively introduced N-dopants for the establishment of the junction itself. Further, N-dopant, e.g., phosphorus will be referred to for the treatment of the vicinity of the grain boundaries to establish a polycrystalline semiconductor silicon solar cell with the advantageous characteristics.

The p-type conductive region of FIG. 4A is shown with a slight bend, which is due to the inherent influence of the untreated grain boundaries. Electric field lines 80, as determined by the equipotential lines 82, may terminate on recombination centers 83 in the grain boundaries which impairs the potential efficiency of the device. There is a loss of electron-hole pairs which might, if separated, produce external voltage and current.

FIG. 4B illustrates how a dopant of N-type first introduced into the grain boundaries by low temperature diffusion and then driven into the material by subsequent high temperature diffusion established an N-type concentration at the grain boundary vicinity. The n-type regions adjacent to the grain boundaries are conductive so that the electrons which follow the electric field lines are efficiently collected. Consequently, the individual single crystalline grains of the polycrystalline columnar structure act collectively as if there were no grain boundary recombination centers. Hence, the collection efficiency is increased over the efficiency of a comparable volume of crystalline material without an especial doping procedure in accordance with the principles of this invention.

The origin of the increased efficiency stems from both the collection efficiency at the grain boundaries and the bending of the depletion region down around the p-type conductive region in such a way that the n-type region substantially encloses the crystal defects, and associated recombination centers, which are topologically connected to the grain boundaries. Thus, the p-type region of FIG. 4B which is labeled 90 for a columnar structure of polycrystalline material has the appearance of a p-type structure. The n-type conductive region does not extend along the grain boundary 93 all of the way to the conductive surface 96 because of the essential existence of a depletion region 95 therebetween. The depletion region 95 is established by the n-type region and either a p-type region near the conductive electrode 96 or a Schottky barrier at the conductive electrode 96. The n-type conductive region 92 now extends substantially down into the volume between the two surfaces 94 and 96 which are the collection surfaces for the electrons and holes respectively which are generated by the incident light on the n-type conductive surface 94.

FIG. 4C shows the circled portion 98 of FIG. 4B in expanded form so that the details thereof can be more readily perceived.

Figure 4D:
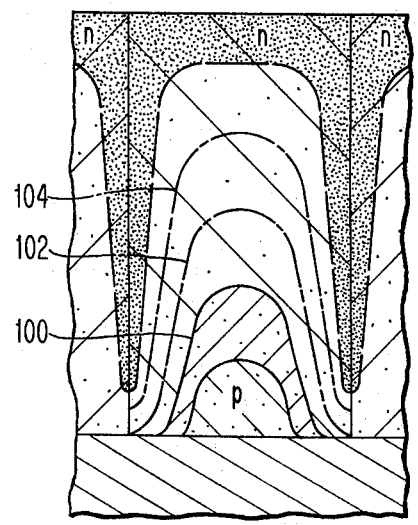
FIG. 4D is a schematic line diagram somewhat comparable to the line diagram of FIG. 4B which shows how a plurality of operational efficiencies can be obtained by various levels of doping in the P region.

FIG. 4D illustrates how an additional benefit from the practice of this invention can be achieved through selective doping of the p-type levels at different concentrations of the P-dopant.

A plurality of dopant concentrations P1, P2 and P3 for the profiles 100, 102 and 104 respectively illustrate the flexibility available for the practice of this invention in optimizing the collection of electron-hole pairs over the efficiency increase due to the treatment of the grain boundaries per se. Since only those electrons produced by the electron-hole pairs generated in the p-type conductive region that are a diffusion length from the depletion region are effectively collected, the electrons generated from electron-hole pairs deeper than that into the p-type region cannot be effectively collected.

Therefore, it is desirable in accordance with the principles of this invention to correlate the concentration of the p-type dopant with the diffusion length for electrons therein for optimum performance of a polycrystalline semiconductor solar cell according to the requirements of a given operational condition.

EXEMPLARY EMBODIMENT OF THE INVENTION

Figure 5A:
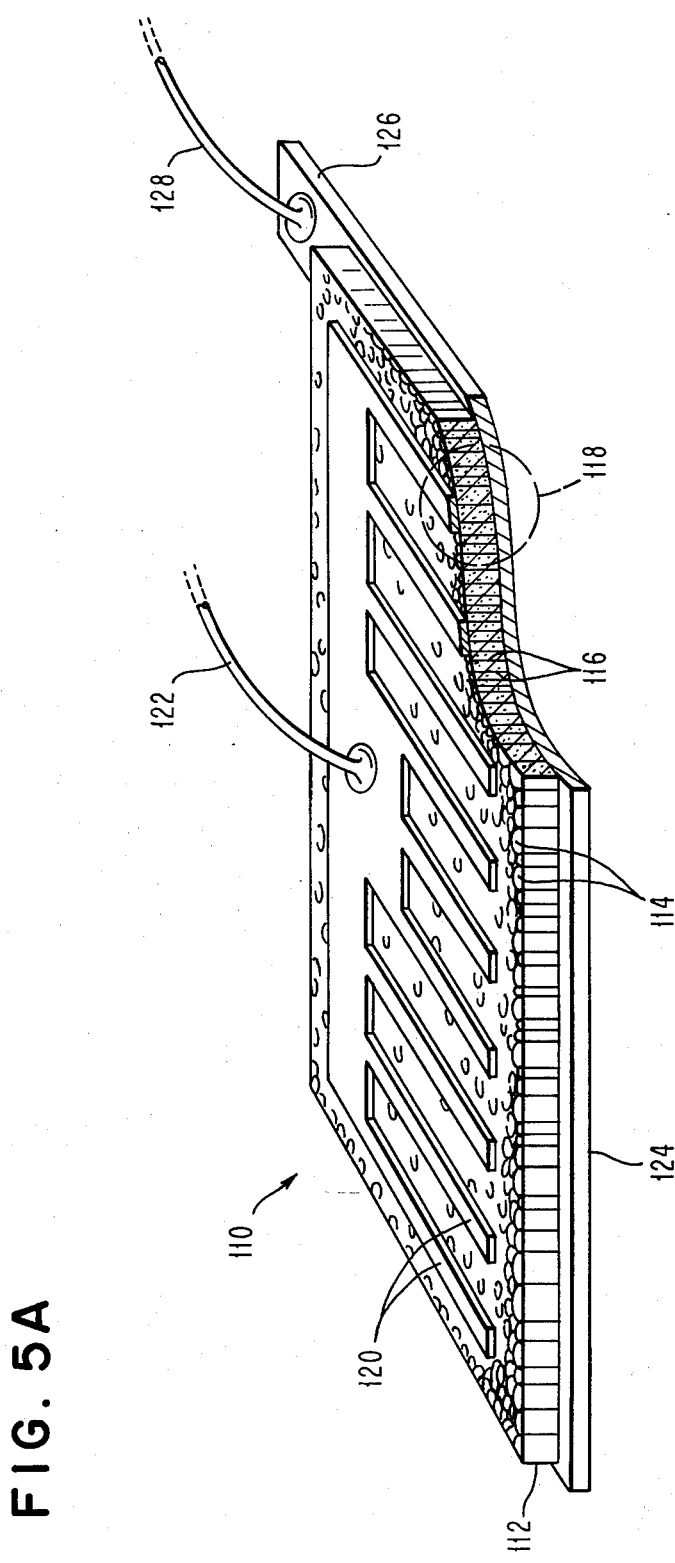
FIG. 5A is a schematic and perspective representation shown as partially delineated in detail of the polycrystalline silicon solar cell offered as an exemplary embodiment of the invention, which involves selectively doping the semiconducting material immediately adjacent to each grain boundary of columnar grains.

The nature and operation of the invention can be understood in terms of the embodiment 110 illustrated in FIG. 5A. The polycrystalline silicon solar cell described as the exemplary and preferred embodiment has an advantage in efficiency over various polycrystalline solar cells of the prior art in that the silicon material adjacent to each grain boundary of the preferred embodiment is selectively doped in such a way as to increase the collection efficiency for charge carriers produced by solar radiation. Thus, excess charge carriers which would normally recombine at the grain boundaries are collected instead as useful current. The resulting increase in overall efficiency allows the use of this solar cell, comprising a polycrystalline silicon semiconductor body, as a practical energy conversion device.

Details of the construction of the polycrystalline silicon solar cell of the preferred embodiment are shown in partial section in the perspective view of FIG. 5A. The polycrystalline semiconductor body 112, whose grain boundaries 116 have been preferentially and selectively doped in accordance with the principles of this invention, is mounted on a metallic back contact plate 124. The positive electrode 126 of the solar cell is contacted by electrically conductive wire 128. Electrical contact to the front of the solar cell is accomplished by conductive contact fingers 120. Electrical contact to the negative electrode of the solar cell is made by electrically conductive wire 122.

Figure 5B:
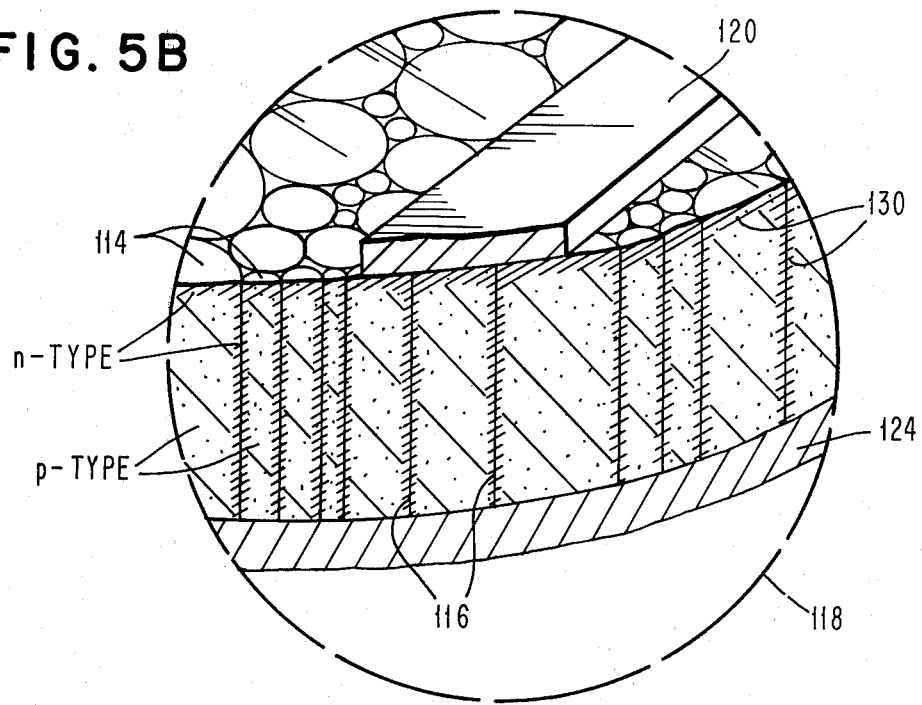
FIG. 5B is an expanded view of a portion of especially delineated silicon section of the exemplary polycrystalline silicon solar cell of FIG. 5A showing the selectively p-type dopant, e.g., phosphorus region near the grain boundaries of the columnar crystalline region.

The sectional view through a portion of the polycrystalline silicon solar cell shown by the circled portion 118 in FIG. 5B illustrates further details of the construction and operation thereof. The conductive metallic fingers 120 form ohmic contacts to the n-type conductive skin 130 which covers the surface region of each grain of the silicon. The back conductive plate 124 forms an ohmic contact to the p-type material comprising the center of each grain. Solar radiation penetrates the polycrystalline silicon material between the metallic finger contacts to a depth of approximately 1 to 100 microns, dopant upon the wavelength of the spectral component of the radiation which is being considered. The conductive metallic contact fingers 120, which are illustratively 10 microns wide and are about 0.5 micron thick, are illustratively spaced about 100 microns apart in order that they not intercept a sizable fraction of the solar radiation incident on the cell. The solar radiation absorbed by the silicon produces electron-hole pairs within each grain, which in this exemplary embodiment comprises largely p-type material.

Of each electron-hole pair, the electron diffuses within the body of the grain until it reaches the vicinity of the grain boundary, where it is collected by the thin n-type conductive skin on the grain. The electron is then conducted from one grain to the next, via the conductive skin of each grain, until it reaches an electrode finger 120, at which point the electron is then collected as a useful electrical current. Further, a hole produced by the solar radiation diffuses until it is collected by the back conductive plate 124. The hole is repelled from the region around the grain boundary by a built in electric field due to the junction between the p-type and the n-type silicon material.

Figure 5C:
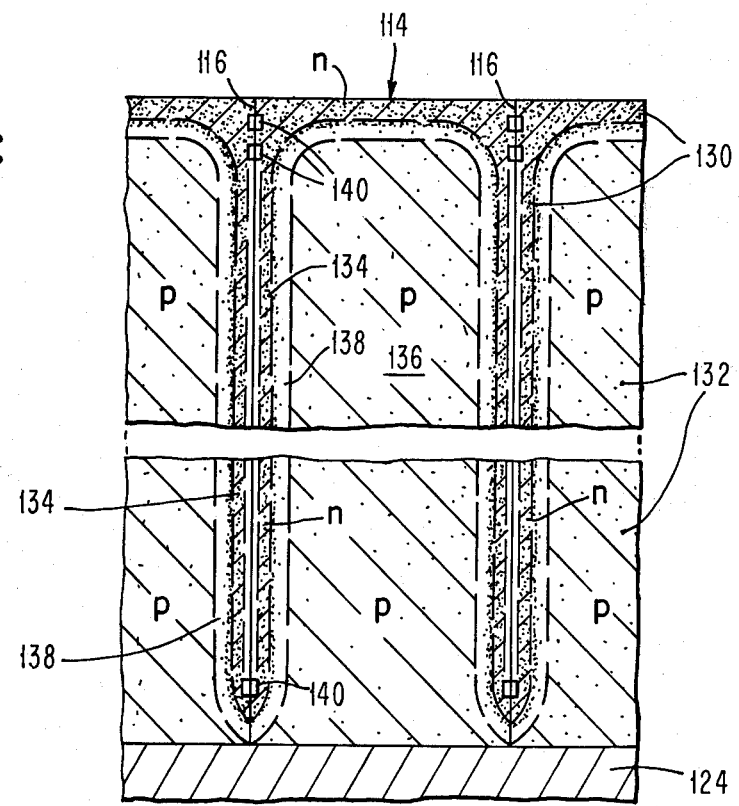
FIG. 5C shows a cross section through one grain of the exemplary solar cell embodiment, showing p-type and n-type conductivity regions which result from the selective P-doping e.g., phosphorus doping of the material near the grain boundaries, wherein the width of the n-type conductivity region and the depletion region are somewhat exaggerated in order to make them visible in the drawing.

The motion of electrons and holes within each grain will be further understood by reference to FIG. 5C, wherein there is represented the cross section of a typical grain of the selectively doped polycrystalline silicon material. Each grain sides is bounded by a grain boundary 116. A thin skin of n-type material 134 completely surrounds the grain on all sides except for the side contacted by the back conductive plate 124. The thickness of the thin, n-type conductive skin, which is somewhat exaggerated in FIG. 5C for clarity of presentation, is about 0.13 microns thick. The center portion of the grain comprises p-type silicon material 136. The depletion region 138 lying between the n-type and the p-type conductive regions has a width of about 0.18 microns. The width of the depletion region 138 is somewhat exaggerated in FIG. 5C for clarity of exposition. In a typical grain, of width greater than 5 microns, the p-type conductive region comprises (according to a calculation for the practice of the invention) more than 97% of the grain volume. The effect of solar radiation is the production of electron-hole pairs largely within the p-conductive region 136 of each grain. The electron of each pair diffuses within the p-type conductive region 136 until it reaches the edge of the depletion region 138, at which point it is swept into the n-type conductive region 134 by the high field in the depletion region. Since the n-type conductive region 134 envelops the grain boundary 116, the excess electrons collected by the n-type region do not recombine with holes in recombination centers 140 in the grain boundary.

Electrons which reach the n-type conductive region 134 are collected as a useful current. Excess holes produced in the p-type material diffuse within the p-type region until they are collected by the electrode 124. Holes which reach the edge of the p-type region 136 are repelled from the grain boundary region by the electric field within the depletion region 138. Thus, the excess holes can not recombine in the recombination centers 140 on the grain boundary 116. However, the small fraction of holes produced within the thin n-type conductive region 134 may recombine with electrons in the recombination centers 140 before they have had a chance to diffuse to the edge of the depletion region 138 where they are collected by the high electric field. The loss of these holes to recombination within the conductive n-type region has only a small effect upon the overall efficiency of the solar cell because only a small fraction of the excess holes are created within the thin n-type conductive region 134.

Figure 5D:
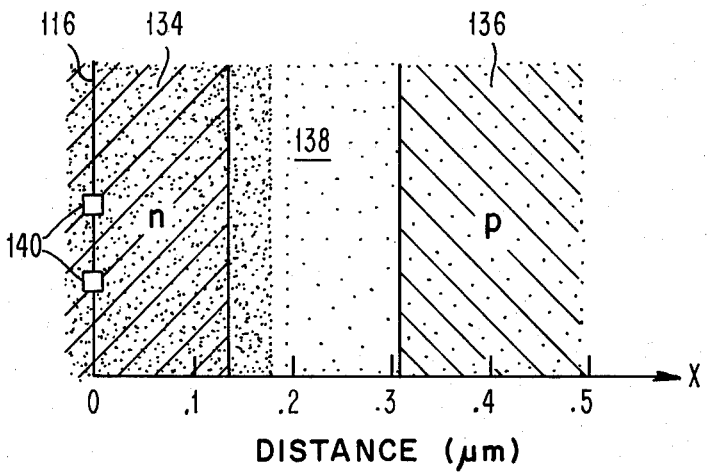
FIG. 5D is an idealized partial cross-sectional view through one grain of the exemplary embodiment solar cell, showing the several conductivity regions produced near the grain boundary by the selective doping of the material near the grain boundaries in accordance with the principles of this invention.
Figure 5E:
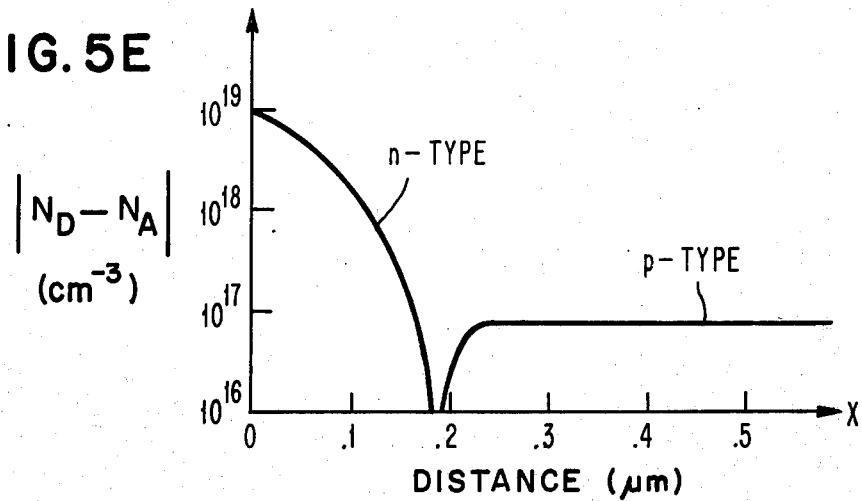
FIG. 5E displays in a graphical form the total effective doping density $|N_D-N_A|$ produced by selectively doping the grain boundary region of the exemplary embodiment of FIGS. 5A and 5B with an N-dopant, e.g., phosphorus dopant.

For purpose of exposition, details of the thin conductive n-type region 134 and the thin depletion region 138 will now be discussed through reference to FIGS. 5D, 5E, and 5F, which show the physical conductivity regions, the total dopant density, and the electron energy, respectively, as a function of distance X from the grain boundary. The thin conductive n-type region 134 adjacent to the grain boundary, the conductive p-type region 136, and the depletion region 138 therebetween are shown in a proper scale in FIG. 5D. The net doping density $|N_D-N_A|$, where D represents donor and A represents acceptor is shown as a function of distance X from the grain boundary in FIG. 5E. This doping profile is the result of the diffusion of exemplary phosphorus dopant from the grain boundary 116 into the body of the grain which supports a background doping level of $8 \times 10^{16}/cm^3$ of boron impurity.

Figure 5F:
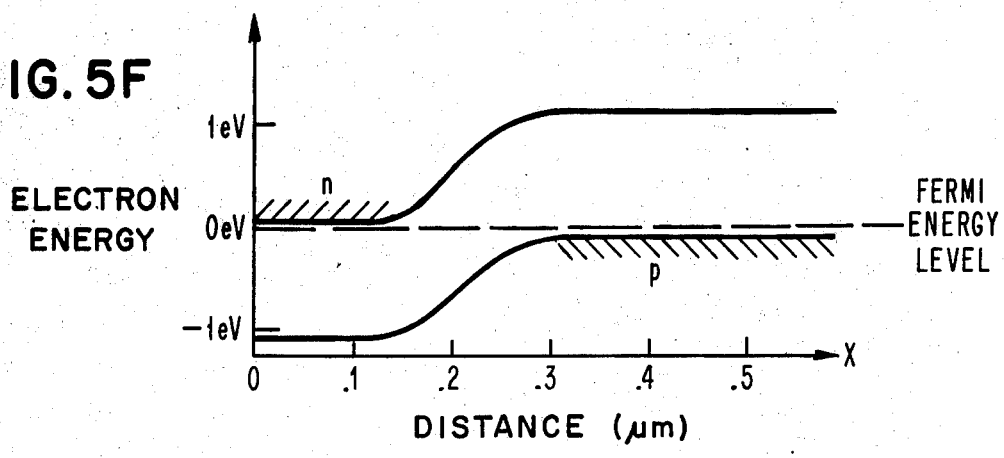
FIG. 5F is a line diagram of the electron energy near a grain boundary of the exemplary embodiment of FIGS. 5A and 5B, showing the built-in electric field provided in accordance with the principles of this invention which collects electrons and repels holes from the region of the grain boundary.

As a result of the diffusion of the phosphorus dopant from the grain boundary and into the surface of the grain, the electron energy diagram is distorted as shown in FIG. 5F. The n-type and the p-type conductive regions establish an electric field in the depletion region therebetween which acts to repel holes away from the region of the grain boundary and which attracts and collects electrons into the n-type conductive skin of the grain. The high efficiency of such a polycrystalline semiconductor solar cell for the practice of this invention results from the fact that holes are repelled from the region of the grain boundary where they would be otherwise destroyed by recombination in the recombination centers 140 associated with the grain boundary 116.

The polycrystalline silicon solar cell of the exemplary embodiment of FIGS. 5A and 5B is fabricated on a polycrystalline slice of silicon 112. The silicon slice, which is about 0.008 inches thick, is preferably cut from a boule of polycrystalline silicon which has been formed by float zone growth. The silicon starting material is preferably doped with a boron impurity to a level of about $8 \times 10^{16}$ boron atoms per cubic cm. The float zone grown silicon material has filamentary columnar crystallites preferentially oriented in the $<100>$ direction parallel to the direction of growth. The individual grains 114 of the polycrystalline silicon slice 112 range in diameter from about 5 microns to about 1000 microns. The semiconductor body 112 is a 1 centimeter square cut from a 1.25 inch in diameter slice of the polycrystalline material such that the filamentary columnar grains are perpendicular to front surface of the semiconductor body 112. In preparation for the preferential doping of the grain boundaries, the polycrystalline silicon piece 112 is preferably etched for 30 seconds in a 1% solution of hydrofluoric acid.

The regions surrounding the grain boundaries of the polycrystalline material are preferentially doped with phosphorus in a two step doping process involving both a low temperature diffusion step and a high temperature annealing step. The polycrystalline silicon piece 112 should then be placed in a tubular furnace containing two separate temperature zones. A flow of dry nitrogen gas is preferably directed through the furnace at a rate of about 0.1 liters per second. The semiconductor piece 112 is then first placed in the low temperature zone held at 250° C. A valve can then be opened for admitting 1% phosphine (PH$_3$) gas by volume to the dry nitrogen gas flow. The valve admitting the phosphine gas is then to be closed after about 15 minutes, and the silicon piece 112 then moved to the high temperature zone of the furnace which is held at a temperature of about 930° C. After 20 minutes at 930° C the silicon piece is cooled to room temperature over a period of approximately 5 minutes. This doping at two different temperatures establishes a doping profile, illustrated in FIG. 5E, around each grain boundary, grain surface, and also around each linear or planar defect which intersects a grain boundary or surface.

The top finger electrodes 120 are then formed on the front surface of the semiconductor body by evaporation in vacuum of a metal alloy through a mask which defines the shape of the finger electrode 120. Before the evaporation, the surface of the semiconductor body 112 is cleaned by etching in dilute 1% hydrofluoric acid for about 1 minute. The finger electrodes, which are about 8 microns wide and about 100 microns apart are formed by vacuum evaporation of two layers of metal. A first layer, which is a gold alloy with about 1% antimony, is evaporated to a thickness of approximately 200A of nickel is then evaporated directly over the first metallic layer. Both layers together comprise the conductive finger electrode 120.

The semiconductor piece 112 is then bonded to a gold plated stainless steel electrode 124 by a gold silicon eutectic solder. A 1% gallium doping in the eutectic solder establishes an ohmic contact between the back contact 124 and the p-type conductive region 136 within each of the grains. To effect the soldering of the semiconductor 112, to the back contact plate 124, by means of the silicon eutectic solder layer therebetween, the components are heated to a temperature of about 480° for several minutes, and then slowly cooled to room temperature.

The finished assembly of the polycrystalline silicon solar cell of the preferred embodiment 110, fabricated in the way described above, has advantages in efficiency over a solar cell fabricated from polycrystalline silicon according to the prior art practice. The contact wire 122 is compression bonded to the top finger electrode 120. When the front surface of the cell 110 is exposed to solar radiation and when wires 122 and 128 are connected to a resistive load, electrons flow from wire 122 to the load, and return through wire 128, thereby providing electrical power to the load.

ADDITIONAL EMBODIMENT OF THE INVENTION

Figure 6A:
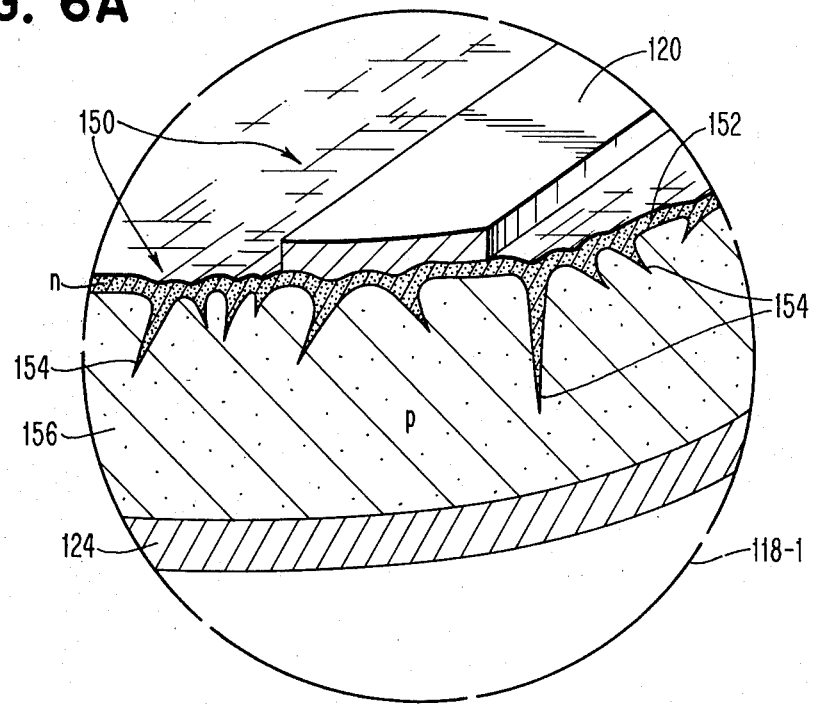
FIG. 6A is a sectional view through one portion of an alternative embodiment of this invention, fabricated from a single crystalline piece of semiconductor silicon in which the section replaces the section shown in FIG. 5B, through a portion of the figure of the complete solar cell shown in FIG. 5A.
Figure 6B:
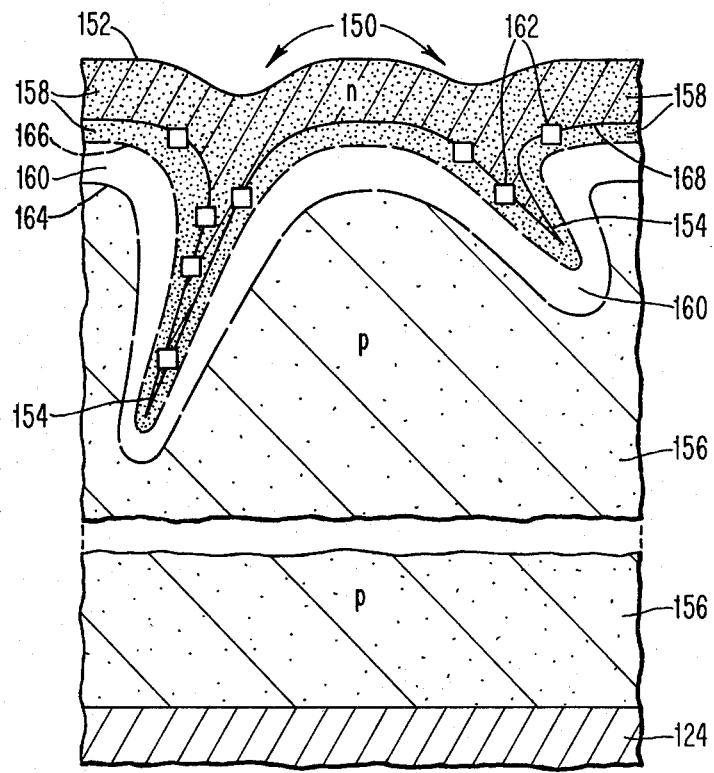
FIG. 6B is a representation of the n-type and p-type conductive regions near the surface of the single crystalline silicon solar cell of the alternative embodiment of FIG. 6B which represents details of a portion of the sectional view in FIG. 6A, showing the n-type and p-type conductive regions as well as the depletion region formed therebetween, which are all shown as distorted to conform to residual crystalline damage on the surface of the semiconductor piece.
Figure 6C:
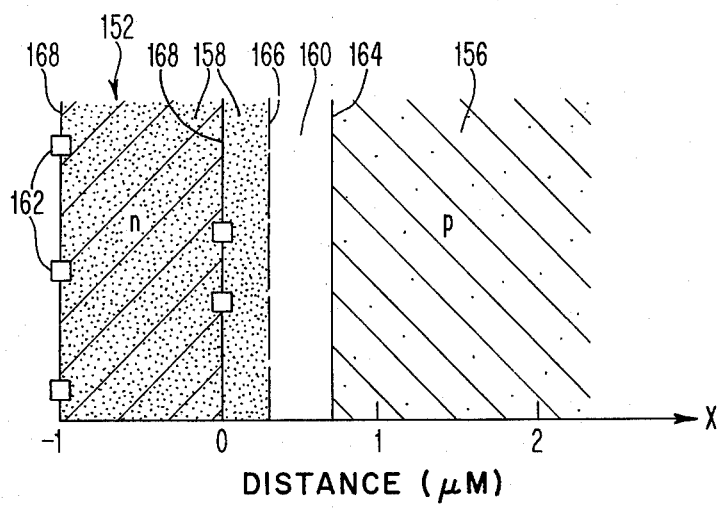
FIG. 6C shows the n-type and p-type conductive regions as a function of distance X from the interface between the semiconductor, e.g., silicon body of FIG. 6B and an additional thin film of heavily N-doped silicon.
Figure 6D:
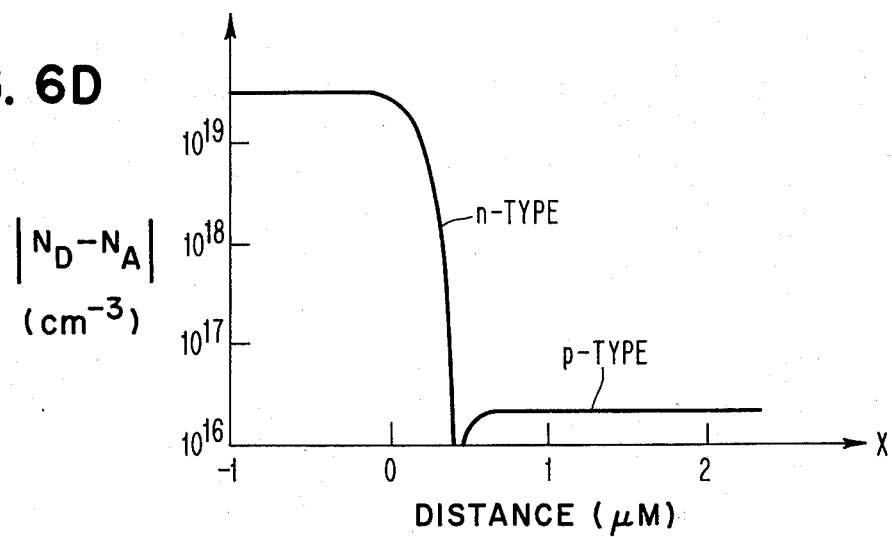
FIG. 6D shows the net doping density $|N_D-N_A|$, as a function of distance X from the interface between the silicon body and the thin film of additionally applied silicon noted above with regard to FIG. 6C.
Figure 6E:
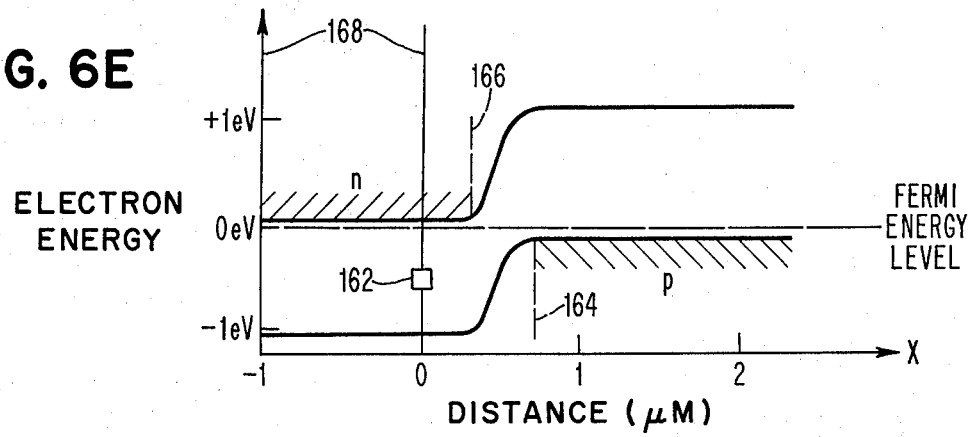
FIG. 6E is a schematic representation of the electron energy near the surface of the semiconductor silicon of FIG. 6C as a function of distance X from the interface between the silicon body and the additionally applied silicon thin film.

Through FIGS. 6A and 6B, and explanatory FIGS. 6C, 6D and 6E, the nature and operation of an additional embodiment of this invention will be presented. It will be correlated with the detailed structure of the embodiment illustrated in FIGS. 5A and 5B by utilization of common reference numbers insofar as applicable. In order to correlate the details of the additional embodiment of FIGS. 6A and 6B, common numbers will be utilized except for the details within the circular representation 118-1 to correspond to the circular representation 118, shown in FIG. 5A and illustrated in detail in FIG. 5B.

The semiconductor body 112 of FIG. 5A is to be replaced by semiconductor body 156, the details of construction thereof to be explained hereinafter. The semiconductor body 156 of this embodiment is a substantially single crystalline piece of silicon material. This single crystal piece of silicon 156 is attached to the electrodes 124 and 120 in a way similar to attachment of the polycrystalline silicon body 112 in the fabrication of the preferred embodiment as described supra.

The single crystal silicon body 156 is a 0.007 inch thick slab of material cut from a single crystal of silicon. The orientation of the slab 156 is such that the surface of the slab is parallel to the (100) crystal face of the single crystal silicon. The silicon material is doped during growth to a level of $2 \times 10^{16}$ boron atoms per cubic cm. A one centimeter square piece is cut from the 0.007 inch thick slab of silicon to form the semiconducting body 156 of this embodiment.

Various surface defects 154 in FIG. 6A are introduced during the cutting of the silicon slab. These defects comprise various linear and planar crystalline defects, such as stacking faults, cracks, dislocations, and dislocation arrays, all intersecting the surface of the silicon piece 156. These various surface defects contain a high density of recombination centers which are deleterious to the operation of any solar cells fabricated thereon. The deleterious effect of the recombination centers in the surface defects is overcome by forming an N-doped region on the surface of the semiconducting body 156 such that it envelops the region of the silicon material surrounding each of the linear and planar defects which intersect the surface of the silicon piece.

The magnified section 118-1 of FIG. 6A shows details of the construction of this embodiment of the crystalline semiconductor solar cell. The silicon material surrounding the surface defects 154 is preferentially etched away by the use of a selective etch as is taught in the prior art. Then, a thin layer of N-doped silicon material 152 is deposited over the surface of the silicon piece 156 and into the space left behind by the preferentially etched surface defects. The silicon layer 152 is heavily phosphorus doped, to achieve an electron density of approximately $3 \times 10^{19}$/cubic cm. During the high temperature deposition of the film 152, some of the phosphorus dopant from this film diffuses a short distance into the boron doped p-type semiconductor body 156. The resulting structure, represented in detail in FIG. 6B, includes a thin skin of highly doped n-type material which conforms to the various surface irregularities 150 which include the above mentioned linear and planar defects. Because of the diffusion of phosphorus dopant from the thin layer 152 into the p-type body 156, the N-doped region 158 extends somewhat beyond the interface 168 between the deposited film 152 and the semiconductor body 156. Thus, the N-doped region 158 envelops the recombination centers 162 which are associated with the various surface defects 154 and with the interface 168 between the silicon body 156 and the deposited film 152.

The thin film of N-type conductive material 152 which covers the surface of the semiconductor body 156 and fills the selectively etched surface defect 154, produces a configuration of conductive regions shown in FIG. 6B. The n-type conductive region envelops the defects 154 and the interface 168 such that the associated recombination centers 162 lie within the n-type region. A depletion region 160 lies between the edge 166 of the n-type conductive region 158 and the edge 164 of the p-type conductive region. Since the n-type conductivity region 158 is relatively thin, about 1 micron thick, the electron-hole pairs produced by solar radiation lie almost entirely within the p-type conductivity region. Electrons of the electron-hole pair, produced by solar radiation in the p-conductivity region, diffuse within that region until they reach the edge 164 of the depletion region 160. The electric field within the depletion region then sweeps the electron through the depletion region to the n-type conductive region 158 where it is collected as a useful current. Holes of the electron-hole pair, produced by radiation in the p-type conductive region, diffuse within that region until they are collected by electrode 124. Those holes which reach the edge 164 of the depletion region 160 are repelled from the depletion region back into the p-region. Thus, holes are prevented from reaching the recombination centers 162, which lie in the surface defects 154 or on the interface 168, and are thereby saved from loss due to recombination. Therefore, it can be seen in this embodiment that a depletion region 160, that is shaped around surface defects and recombination centers, acts to enhance the collection of electrons and holes produced by solar radiation, thereby increasing the efficiency of a silicon solar cell fabricated according to the teachings of this embodiment.

The local configuration of n-region 158, the depletion region 160, and the p-region 156 are shown in FIGS. 6C, 6D and 6E. FIG. 6C shows a cross section through a surface defect which is preferentially filled by n-type material 152 delineated by the boundary 168. During formation of the highly doped n-type region 152, some of the phosphorus dopant of the n-region diffuses a small fraction of a micron into the single crystal of silicon, extending the n-region 158 about 0.3 microns beyond the interface 168 into the semiconductor 156. This establishes the depletion region 160 and the edge 164 of the p-region in a portion of the material which is at least several tenths of a micron from the recombination centers 162 on the interface 168. An approximate representation of the net doping density $N_D$-$N_A$ is shown in FIG. 6D. The boundary between the net n-doped region and the net p-doped region occurs at a distance X of about 0.3 micron from the growth interface 168. The electronic energy bands established by the n-type conductive skin are represented as a function of distance X from the growth interface 168 in FIG. 6E. The n-type phosphorus dopant which diffuses from the growth interface 168 into the semiconductor material establishes a depletion region between the edge 166 of the n-type conductive region, and the edge 164 of the p-type conductive region. The fields within the depletion region between 164 and 166 are formed in such a way that excess holes within the p region are repelled from the vicinity of the interface 168 on which they may recombine.

A body of semiconductor material 156, comprising the semiconductor portion of this alternative embodiment, is formed on a single crystal piece of silicon. The silicon is a 0.007 inch thick slab cut from a 1.25 inch diameter silicon crystal oriented in the <100> direction. The silicon crystal is initially boron doped to a density of $2 \times 10^{16}$ atoms per cubic centimeter to form a p-type crystal. A 1 centimeter square of material is cut from the silicon slab. The silicon piece is not lapped or polished, so that damage from the saw cutting remains on both surfaces. The silicon material is etched in a solution of 1% hydrofluoric acid (Hf) for about 5 minutes, and then rinsed in deionized water for several minutes.

An alternative embodiment of this invention substitutes a polycrystalline slab of silicon for the semiconductor body 156 in which the surface topography is treated in such a way as to cause deep grain boundary grooves by preferential etching of the grain boundary region. These grooves produce the same structures as depicted in FIGS. 6A and 6B wherein surface damage produced by saw cutting is replaced by grain boundary grooves. The surface of the grooves would be depicted as interface 168 in accordance with FIG. 6B.

The silicon piece is dried after the etching procedure and then loaded into the quartz tube of radio frequency heated furnace. After sealing the furnace, a mixture of 10% hydrogen in argon is preferably passed through the furnace at a flow rate of approximately 0.1 liter per second. The silicon piece and its pyrolytic graphite holder are moved to the active region of the furnace which lies within the heating coil thereof. Radio frequency power was applied in order to heat the sample to 1010° C over a period of about 5 minutes. The gas flow is maintained during the heating step. After stabilizing the temperature at 1010° C, essentially 6 additional percent by volume of hydrogen chloride gas is added to the gas flow for a period of 5 minutes. The effect of the hydrogen chloride addition is to etch about 2 microns of material, on the average, from the saw-damaged silicon surface. However, the etch rate is higher in the vicinity of defects which intercept the surface, so that these defects are preferentially etched away. The use of a preferential, gas-phase etching procedure to selectively etch away silicon material near the surface imperfections thereof is well known in the prior art, such as found in W. R. Runyan, *Silicon Semiconductor Technology*, (McGraw-Hill Book Company, New York, 1965), pp. 72 and 73. After the etching step, the 6% of hydrogen chloride gas is switched off and a mixture of gases including silicon chloride and phosphine is switched on for about 30 seconds. This mixture of gases, which comprised 6% of the total gas flow by volume, is itself a mixture of 98% silicon chloride gas and 2% of a mixture of gas including 1% phosphine in hydrogen. The intent of this second step is to deposit about 1 to 3 microns of heavily phosphorus doped silicon over the surface of the silicon body and into the surface defects which have been preferentially etched. The sample is then allowed to cool for a period of several minutes in a hydrogen gas flow. The silicon body 156 is then removed from the furnace and electrodes 124 and 120 are applied to it in accordance with the techniques described in the fabrication of the exemplary embodiment shown in FIGS. 5A and 5B. The resultant structure of this embodiment is represented in the sectional sketch 118-1 as described above.

Considerations for the Invention

The practice of this disclosure envisions a crystalline radiation responsive device or solar cell wherein an increased efficiency is achieved by a special selective treatment of the grain boundaries or other defects thereof. It is anticipated that the semiconductor crystalline device for the practice of this invention comprises an imperfect single crystal or that it comprises a material which has columnar grains; and that to the extent the film involved does not have columnar grains there is an overall reduced efficiency of the device but not an inoperative device per se.

For the practice of one aspect of this invention, any grain boundaries will be preferentially doped in an intermediate stage of fabrication, leading to doping around the region of the grain boundaries by a subsequent heat treatment.

Through another aspect of this invention, it is contemplated to increase efficiency of the device by extending the contact surface proximate to the incident radiation so that there is increased efficiency of collection of the electrons. Finally, in the contemplated practice of this invention there will be a partial treatment of the grains so as to cause the grain boundaries or other defects topologically interconnected to the surface to be substantially conducting.

The general objective of the disclosure is to describe a process by which one can utilize imperfect crystalline semiconductors to fabricate high efficiency solar cells. The basic difficulty with semiconductors which are polycrystalline or which contain linear or planar defects is the defective crystalline regions which act as recombination sites for the carriers generated by radiation. An objective of the invention is to describe a technique by which one can reduce the deleterious effect of the grain boundaries or other surface imperfections and therefore make the efficiency of the device either simulate or improve that of a single crystal.

One way in which it is proposed to accomplish an increased efficiency is to preferentially introduce an N-dopant solute into the n-region surrounding grain boundaries and other defects in such a way that the electronic potential decreases (or increases for the opposite dopant) in the region surrounding the defects. That is, electrons will be collected and holes rejected at the region around the defect (or vice versa for the opposite dopant). It is important that solute extend into the lattice region surrounding the defect.

It is also important that the field in the region surrounding the defect extend over distances greater than 100A. The reason is that an electron (or hole) moving in the region of the heavily doped region can tunnel through the depletion region and short out the junction if the allowed tunnelling distance is in the order of the depletion width.

Practice of this invention requires that the solute move a finite distance into the crystalline lattice from the imperfect or defective regions in such a way that the solute atoms dope the material and establish a highly conductive layer around each defect. Also, the electric field due to the heavy doping extends far enough into the lattice to prevent the electrons from tunnelling through the junction. The principles of this invention teach a means for preventing carriers of one type from reaching the defects and from recombining thereon.

Even single crystalline semiconductor materials are improved by practice of this invention for efficient radiation responsive devices which do not have substantial deleterious defects.

In the operation of the device of this invention, the electron-hole pairs generated during the radiation are able to separate in such a way that one carrier goes to one surface and the other carrier goes to the opposite surface. The two surfaces are the two sides of a junction region in the system, either a p-n junction or a Schottky junction. For example, with a Schottky barrier on the back surface, holes will be accelerated into the Schottky barrier on the back and electrons will be rejected from the Schottky barrier such that a natural splitting of electron-hole pairs will be produced by the field. The electrons would then be collected at the top surface and the holes would be collected at the bottom surface. The current produced is then a function of the number of electrons and holes that are collected. The effectiveness of a grain boundary in reducing efficiency is due to the carriers that are recombined prior to being collected at a suitable electrode. Doping of the grain boundaries in the manner described in this invention greatly increases the collection efficiency and prevents premature carrier recombination prior to collection.

It should be pointed out that radiation sensitive devices or solar cells can be made by interchanging the carrier types; that is, reversing the conductivity type of the selectively applied basic with the conductivity type of the dopant of the semiconductor itself does not change the basic operation and efficiency of the cell.

So far in this section a cell is described which contains material that has a columnar grain structure whose grain boundaries are approximately normal to the surface. The stipulation that the crystal be columnar does not necessarily stipulate that the orientation of the grain boundaries be normal to the surface. Indeed, depending upon how the layer is deposited, grains can be grown directionally and thereby grain boundaries can be obtained.

There are many different types of semiconductor materials which can be used in solar cells or in radiation responsive devices ranging from elemental silicon and dermanium and from the III-V compounds II-VI compounds; as a function of the energy gap, different efficiencies can be obtained.

It is desirable for the practice of this invention that the active material in which electron-hole pairs are produced as a semiconductor. Further, it is desirable to increase substantially the density of at least one type of free carrier (electron or holes) within the material by the introduction of impurity dopant atoms.

Also, the practice of this invention applies to the preparation of bulk material for solar cell applications; that is, a slab is cut out of a polycrystalline bulk material such that the structure of FIG. 1 is achieved. That is, in bulk materials and slabs cut from bulk materials, the grain boundaries usually run in the direction of growth, and therefore, slicing the wafers in a direction perpendicular to the direction of growth produces grain boundaries which will also be perpendicular to the surface.

Another fabrication technique for the practice of this invention utilizes ribbon growth to produce suitable semiconductor material without the necessity of slicing and surface finishing. Again, in many instances ribbons contain grain boundaries which are nearly normal to the surface. Thus, solar cells or other devices made from ribbon material contain grain boundaries which are similar in structure to FIG. 1. The practice of this invention encompasses any polycrystalline semiconductor of required thickness fabricated either by direct growth on suitable substrates, or by bulk growth, or by slicing wafers.

A further feature of the invention which includes a selective grain boundary doping scheme is increased collection efficiency for carriers produced deep in the semiconducting medium. The doped region around the grain boundaries forms a conducting network and extends deep into the material, which essentially pulls carriers into the collecting electrode. In this way, carriers produced deep in the semiconductor within a diffusion distance of the depletion region surrounding the collector regions are collected efficiently, rather than recombining in grain boundaries or other defects. Since the conductive collecting medium extends far down into the bulk of the active regions, the carriers produced deep in the semiconductor solar material can be collected efficiently. Therefore, grain boundaries or other defects can be used in such a way that more carriers can be collected for a given incident radiation that would be collected in a single crystal, in which electron-hole pairs produced at a large distance from the surface would not be collected efficiently prior to recombination.

Another technique for producing the desired field line distribution illustrated, for example, in FIG. 4B, is to produce a surface topography in which the grain boundaries are grooved, e.g., either by chemical etching or by thermal grooving. Adding a top layer of conductive region, for example n-type silicon on p-type material, provides essentially collecting fingers for efficiently carrying electrons to the top surface. In this way collection of carriers produced far from the surface can be accomplished.

Another method of producing the desired field line distribution as exemplified in FIG. 6, is the case where a single crystalline region is altered to provide higher efficiency by utilizing collecting conductive zones of either n-type or p-type as required for practice of this invention. One embodiment practice of the invention as shown in FIG. 6 is provision of internal defects, such as dislocations or microcracks, into which a conducting layer, such as n-type silicon on a p-type region can be deposited. Again deep collection is achieved.

It is an important teaching of this invention that collecting fingers or zones can be produced in solar cell devices, in both single crystalline and polycrystalline regions which enhance the efficiency of carrier collection and reduce the probability for recombination at lattice or surface defect centers.

We claim:

1. Radiation responsive device comprising:
   a semiconductor body having a carrier collection surface adapted to receive said radiation, metallic contacts connected to said body for substantially collecting electrons and holes generated by incident radiation in the active volume of said semiconductor body as external current,
   said semiconductor body comprising
   a crystalline semiconductor region of a given conductivity type having defects therein selected from the class consisting of linear and planar defects which are topologically connected to said radiation receptive surface including therewith recombination centers thereat for charge carriers,
   zones of relatively high dopant concentrations of opposite conductivity type proximate respectively to said defects and which substantially envelop them for establishing an electric field pattern in said active volume of said semiconductor body which repels one of said electrons or holes, and collects the other of said electrons or holes, and
   semiconductor junction means in association with said semiconductor region which together with said zones of dopant concentrations establishes said electric field pattern.

2. Device as set forth in claim 1 wherein said semiconductor region is comprised of a material selected from the class consisting of Si, Ge, CdS, CdSe, CdTe, GaAs, GaP, ZnO, ZnS and InP.

3. Device as set forth in claim 1 wherein said crystalline semiconductor body is polycrystalline.

4. Device as set forth in claim 3 wherein polycrystalline body is columnar.

5. Device as set forth in claim 1 wherein said crystalline semiconductor body is single crystalline.

6. Device as set forth in claim 1 in which said semiconductor region is selectively responsive to solar radiation.

7. Device as set forth in claim 1 wherein said semiconductor region is comprised of Si and said dopant is selected from the class consisting of As and P.

8. Device as set forth in claim 1 wherein said semiconductor junction is a p-n junction.

9. Device as set forth in claim 1 wherein said semiconductor junction is a Schottky barrier junction.

* * * * *